United States Patent [19]
Uchida et al.

[11] Patent Number: 5,307,296
[45] Date of Patent: Apr. 26, 1994

[54] SEMICONDUCTOR WORKPIECE TOPOGRAPHY PREDICTION METHOD

[75] Inventors: Tetsuya Uchida; Masato Fujinaga, both of Itami, Japan

[73] Assignee: Mitsubishi Denki Kabushiki Kaisha, Tokyo, Japan

[21] Appl. No.: 771,106

[22] Filed: Oct. 4, 1991

Related U.S. Application Data

[63] Continuation-in-part of Ser. No. 493,456, Mar. 14, 1990, abandoned.

[30] Foreign Application Priority Data

Nov. 17, 1989 [JP] Japan .................................. 1-297474

[51] Int. Cl.$^5$ ............................................. G06F 15/60
[52] U.S. Cl. ..................................... 364/578; 364/468
[58] Field of Search ............... 364/578, 488, 489, 491, 364/468, 469, 551.01; 437/952, 958, 225; 204/192.33, 192.35

[56] References Cited

U.S. PATENT DOCUMENTS

| | | | |
|---|---|---|---|
| 5,031,127 | 7/1991 | Fujita et al. | 364/578 |
| 5,067,101 | 11/1991 | Kunikiyo et al. | 364/578 |
| 5,070,469 | 12/1991 | Kunikiyo et al. | 364/578 |
| 5,086,015 | 2/1992 | Itoh et al. | 437/225 |
| 5,097,432 | 3/1992 | Harada et al. | 364/578 |

OTHER PUBLICATIONS

Fujinaga et al, "Three-Dimensional Topography Simulation Model Using Diffusion Equation", Technical Digest, International Electron Devices Meeting, Dec. 1988, pp. 332–335.

Robinson et al, "Ion-Beam-Induced Topography and Surface Diffusion", Journal of Vacuum Science Technology, vol. 21, No. 3, 1982, pp. 790–797.

Primary Examiner—Jack B. Harvey
Assistant Examiner—Ellis B. Ramirez
Attorney, Agent, or Firm—Leydig, Voit & Mayer

[57] ABSTRACT

A method of predicting the topography of a semiconductor workpiece after a plurality of manufacturing processes, such as etching and film deposition, are carried out on the workpiece includes establishing a desired topography for a semiconductor workpiece after sequential performance of a plurality of processes, such as etching, are carried out on the workpiece; specifying conditions, such as temperature and etchant concentration, for each process; establishing a plurality of points in a grid in a space including the workpiece; identifying the materials comprising the workpiece and the concentration of virtual particles representing the topography of the workpiece before a first process; using the modified diffusion model equation to predict the material and concentration of virtual particles after the completion of the first process in the sequence of processes; recording the material and virtual particle concentration at the completion of the first process as a decimal number including an integer part representing the material and a decimal part representing the concentration of virtual particles; and using the modified diffusion model to predict the materials and concentration of virtual particles after a second process beginning with the materials and virtual particle concentrations from the prediction of the first process.

1 Claim, 10 Drawing Sheets

| 1.1 | 0.7 | 0   | 0   | 0.7 | 1.1 |
|-----|-----|-----|-----|-----|-----|
| 1   | 1.4 | 0.6 | 0.6 | 1.4 | 1   |
| 1   | 1   | 1.3 | 1.3 | 1   | 1   |
| 2   | 2   | 2   | 2   | 2   | 2   |
| 2   | 2   | 2   | 2   | 2   | 2   |

FIG. 10A
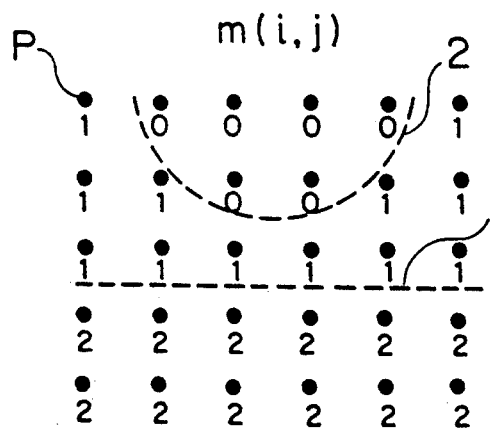
FIG. 10B
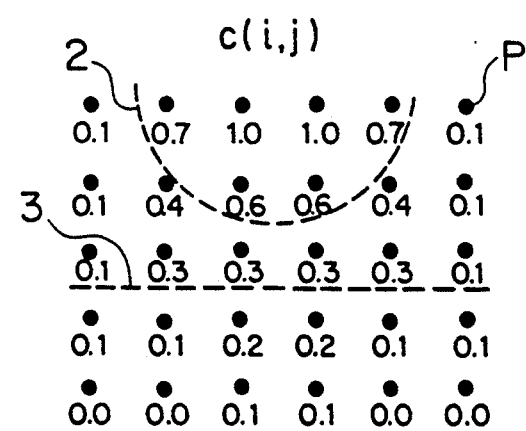
FIG. 10C
|   |   |   |   |   |   |
|---|---|---|---|---|---|
| 1 | 0 | 0 | 0 | 0 | 1 |
| 1 | 1 | 0 | 0 | 1 | 1 |
| 1 | 1 | 1 | 1 | 1 | 1 |
| 2 | 2 | 2 | 2 | 2 | 2 |
| 2 | 2 | 2 | 2 | 2 | 2 |
FIG. 10D
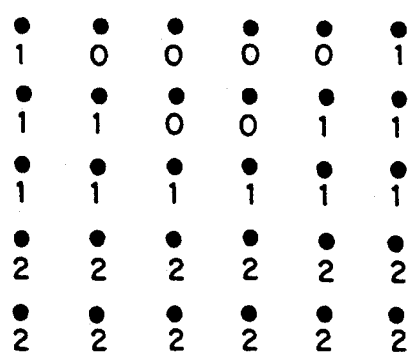
FIG. 10E
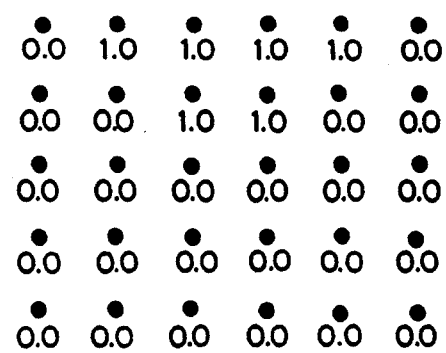

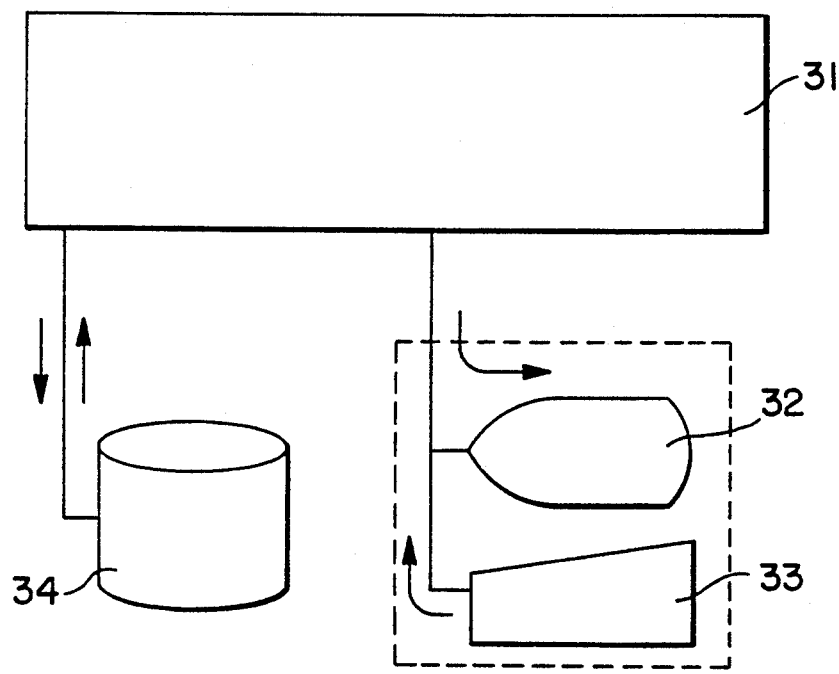
F I G. 11

F I G. 13
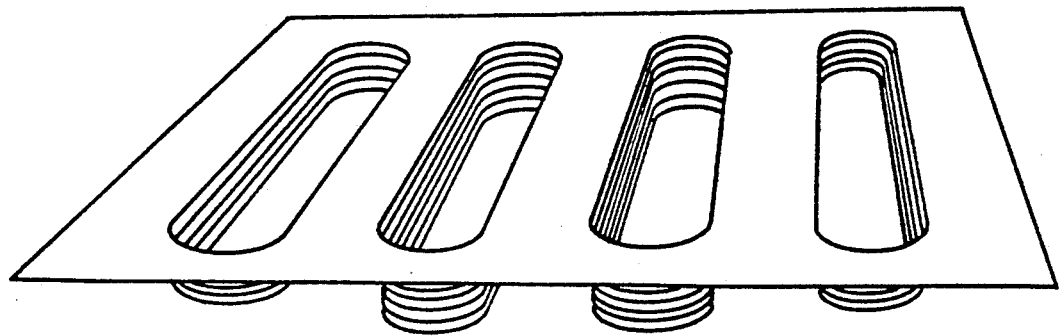

SEMICONDUCTOR WORKPIECE TOPOGRAPHY PREDICTION METHOD

This disclosure is a continuation-in-part of U.S. patent application Ser. No. 07/493,456, filed Mar. 14, 1990, now abandoned.

FIELD OF THE INVENTION

The present invention relates to a method of accurately predicting the topography of a semiconductor workpiece after a plurality of processes have been carried out on the workpiece in order to determine appropriate process conditions for manufacturing a semiconductor workpiece having a desired topography.

BACKGROUND OF THE INVENTION

Some methods for predicting changes in the topography, i.e., the shape of the surface, of a semiconductor workpiece in a manufacturing process, such as etching of the workpiece, deposition of a film on the workpiece, and oxidation of the workpiece, use the modified diffusion model. In these methods, the topography of the workpiece is represented by a surface composed of virtual particles distributed in a space that includes the surface. In these methods, changes in topography are considered to result from the diffusion of the virtual particles. A method employing the modified diffusion model as applied to wet etching is briefly described below.

FIG. 4 illustrates changes in the topography of a semiconductor workpiece during wet etching. A silicon oxide film 21 is disposed on a silicon substrate 20 and a mask 22 is disposed on the oxide film 21. An etchant flows through an opening in the mask 22 and etches the substrate 20 and the oxide film 21. An etching front 2 moves in the directions indicated by the arrows 23. The arrows 24 indicate the flow of the etchant. The portions of the substrate 20 and of the oxide film 21 that have been removed by etching are indicated by reference number 25. The changes in the topography of the materials in the etching process are predicted using the modified diffusion model as described below.

Initially, the concentration of the virtual particles distributed in the space is $C(r, t)$, where $r = r(X, Y, Z)$ is the spatial position specified by the coordinates X, Y, and Z and t is time. An etching front is expressed as a contour surface $C(r, t) = C1$, where C1 is a constant. Examples of contour surfaces for different constant values of C are shown in FIG. 5. For example, $C(r, t) = 0.30$ is indicated by a dashed line 26. The contour surface representing the etching front, which may be $C1 = 0.50$, is shown by the solid line 2. The concentration $C(r, t)$ of the virtual particles represents the topography of the workpiece, is high in the etched portion 25 of the materials shown in FIG. 4, and is low within the substrate 20. When using the modified diffusion model, after the etched topography has been expressed at an initial time as a concentration $C(r, t)$ of virtual particles as described above, the diffusion Equation (1) set out below is solved to determine the concentration $C(r, t)$ at a later time.

$$(\partial C/\partial t) = D_x(\partial^2 C/\partial X^2) + D_y(\partial^2 C/\partial Y^2) + D_z(\partial^2 C/\partial Z^2) \quad (1)$$

Thus, the etching front 2 is determined as the surface where $C(r, t) = C1$. The diffusion coefficients $D_x$, $D_y$, and $D_z$ employed in Equation (1) are determined from actual etching rate measurements. For example, in a case where the etching rate of the substrate 20 is higher than that of the oxide film 21, the diffusion coefficients for the substrate 20 are set to larger values than the diffusion coefficients for the oxide film 21. Because of the different diffusion coefficients, the rate at which the surface of the substrate 20 changes is faster than the rate at which the surface of the oxide film 21 changes. The diffusion coefficients of the etched portion 25 are set to large values compared to those of the substrate 20 and the oxide film 21 so that the concentration of virtual particles in the etched portion 25 is substantially constant.

Prediction of the topography of a semiconductor workpiece using the modified diffusion model has been briefly described. The procedure for solving the diffusion Equation (1) in carrying out the prediction is described next.

Initially, a space including the surface of a semiconductor workpiece is divided into a large number of points $P(i, j)$ in a mesh or grid, as shown in FIG. 6. Next, an array $C(i, j)$ of the virtual particles representing the surface of the workpiece and an array $m(i, j)$ of the various materials of the workpiece is prepared with respect to the individual mesh points $P(i, j)$. If no material that will be etched exists at a mesh point $P(i, j)$, $m(i, j)$ is zero. If the oxide film 21 is present at a mesh point $P(i, j)$, $m(i, j)$ is 1 for that mesh point. If the substrate 20 is present at a mesh point $P(i, j)$, then $m(i, j)$ is 2 at that mesh point. The array $m(i, j)$ of materials is used to select the diffusion coefficients $D_x$, $D_y$, and $D_z$ at the individual mesh points. The diffusion Equation (1) is solved using these arrays and diffusion coefficients to determine the concentration distribution of virtual particles at a time t.

The concentrations obtained for the individual mesh points $P(i, j)$ are interpolated to draw a contour surface $C = C1$, e.g., $C1 = 0.50$, to represent an etching front 2, as shown in FIG. 7. In FIG. 7, the numbers written below the respective mesh points $P(i, j)$ represent the concentrations $C(i, j)$ determined for those points.

Predictions of the topographic changes produced by one process, i.e., etching, have been described. In an actual semiconductor manufacturing operation, topographic predictions must be made for a plurality of processes. For example, a contact hole may be formed by two sequential processes, e.g., wet etching followed by dry etching, as indicated in FIGS. 8 and 9, In a first process, indicated in FIG. 8, a relatively wide recess 27 is formed in the oxide film by wet etching in order to improve the coverage of an aluminum metallization subsequently deposited on the surface. In a second, subsequent process illustrated in FIG. 9, a hole 28 extending from the recess 27 to the substrate 20 is formed by dry etching.

In order to predict the topography of a semiconductor workpiece after at least two sequential processes have been carried out, the concentrations $C(i, j)$ as well as the materials $m(i, j)$ at the individual mesh points $P(i, j)$ which are predicted for the conclusion of the first process, e.g., wet etching, are used as the initial conditions for the subsequent process, e.g., dry etching.

Conventionally, of the materials $m(i, j)$ and the concentrations $C(i, j)$ for the individual mesh points $P(i, j)$, as shown in FIGS. 10A and 10B, respectively, which are determined for the completion of a first process, only the materials array $m(i, j)$ is saved, for example, as indicated by the array of FIG. 10C, for use in topography predictions for subsequent processes. In FIG. 10A, the numbers below the respective mesh points P(i, j) represent the materials m(i, j) at the respective mesh points. In FIG. 10B, the numbers written below the individual mesh points represent the concentrations C(i, j) for the respective mesh points. The etching front is indicated by the number 2 and the interface between the substrate 20 and the oxide film 21 is denoted by the number 3.

In the second process, the initial values of the materials m(i, j), as shown in FIG. 10D for the respective mesh points, are the values at the end of the first process as indicated in FIG. 10A. The concentration C(i, j) is 1.0 where no material to be etched exists and 0.0 where material to be etched is present, as shown in FIG. 10E. Use of only the materials array, i.e., m(i, j), without the use of the concentration array C(i, j), decreases the amount of data employed in each subsequent step of a prediction method.

Recent manufacturing techniques for making integrated circuits generally employ at least one hundred sequential processes. A three-dimensional topography prediction employs several million mesh points P. In using the modified diffusion model, the concentrations, other than those for the contour surface where C(r, t)=C1, representing an etching front, do not much affect the predicted topography. Hence, conventionally, only the materials array m(i, j) from one process is used as an initial value for the next subsequent process without a similar use of the concentration array C(i, j) to provide initial conditions for the next subsequent process.

Since the concentration array from the conclusion of the first process is discarded, the initial values of the concentrations C(i, j) for the second process are set to either zero or 1. However, this step prevents the topography predicted at the completion of the first process from being completely and accurately reproduced at the beginning of the second process. As a result, the accuracy of the topography prediction decreases with each subsequent process. When the topography is predicted after one hundred or more sequential processes, the accuracy of the prediction of the final topography is poor.

SUMMARY OF THE INVENTION

The present invention is directed to eliminating the aforementioned problems of the conventional workpiece topography prediction method. An object of the invention is to provide a method of accurately predicting the topography of a semiconductor workpiece after a large number of sequential processes have been carried out on the workpiece without requiring the use of an excessive amount of topography information predicted for the preceding processes.

To this end, the present invention provides a method of accurately predicting the topography of a semiconductor workpiece after the completion of a plurality of sequential processes so that the parameters of the processes can be determined to provide a desired topography at the completion of the sequential processes in order to ensure proper performance of a semiconductor device produced by the sequential processes. The prediction model eliminates any need to carry out numerous experiments to predict proper processing conditions to ensure, for example, that proper metallization coverage is obtained.

A prediction method according to the invention comprises establishing a desired topography for a semiconductor workpiece after the sequential performance of a plurality of processes, such as etching, are carried out on the workpiece, specifying conditions, such as temperature and etchant concentration for each process, establishing a plurality of points in a grid in a space including the workpiece, identifying the materials comprising the workpiece and the concentration of virtual particles representing the surface of the workpiece at each of the points before a first process on the workpiece, using the modified diffusion model to predict the materials and concentrations of virtual particles at each point after the completion of the first process in the sequence, recording both the material and virtual particle concentration for at least some of the points at the completion of the first process as a decimal number including an integer part representing the material and a fractional part representing the concentration of virtual particles, using the modified diffusion model to predict the material and concentration at each point after a second process beginning with the materials and virtual particle concentrations for each point from the prediction of the first process, repeating the topography prediction for each of the plurality of processes to predict a final topography, each prediction employing as initial materials and virtual particle concentrations the materials and virtual particle concentrations predicted at the completion of the immediately preceding process, graphically displaying the final topography and comparing the final topography to the desired topography, altering the conditions of at least one of the processes, and repeating the topography prediction and graphical display steps until the desired topography is obtained for the sequence of processes.

BRIEF DESCRIPTION OF THE DRAWINGS

FIGS. 3A-3E respectively illustrate applications of the topographic prediction method according to the present invention;

FIGS. 10A-10E illustrate a conventional topography prediction method;

FIG. 11 is a schematic illustration of a computer system for predicting workpiece topography according to the invention;

FIG. 13 is an illustration of a graphical prediction of the topography of a workpiece produced according to the invention.

DETAILED DESCRIPTION OF PREFERRED EMBODIMENTS

Figure 8:
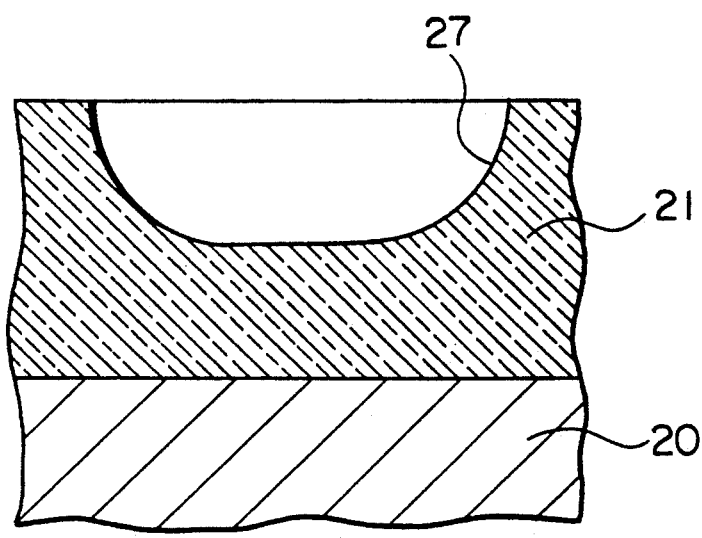
FIGS. 8 and 9 are respectively cross-sectional views of a workpiece on which a wet etching process and on which successive wet and dry etching processes have been carried out to form a contact hole.
Figure 9:
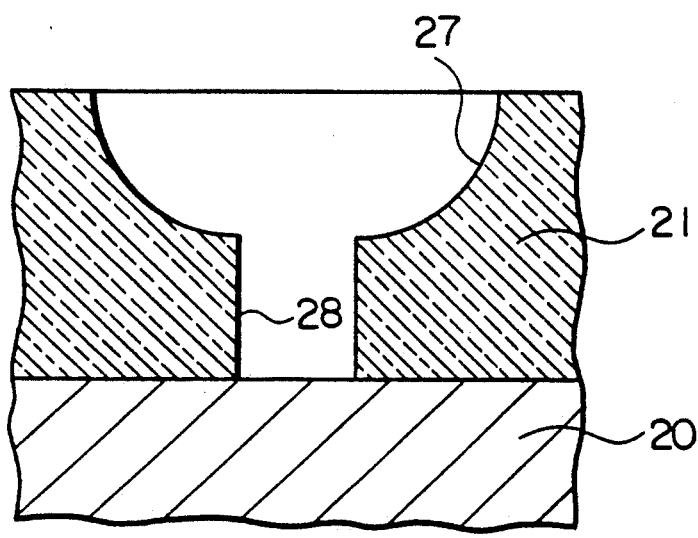

A prediction of the topography of a contact hole formed by two consecutive processes, i.e., wet etching and dry etching, is illustrated in FIGS. 8 and 9. The topography after the completion of the wet etching process is shown in FIG. 8 in cross-section. After the subsequent dry etching process, the contact hole having the cross-sectional topography shown in FIG. 9 is produced. In the wet etching process, a recess 27 is formed in the oxide film 21.

Initially, the space occupied by the substrate 20 and the oxide film 21 including the volume where the contact hole is to be formed is divided into a large number of mesh points $P(i, j)$. An etching front at the time t is predicted using the modified diffusion model just as described for the conventional prediction method. Specifically, the concentration array $C(i, j)$ of the virtual particles as well as the materials array $m(i, j)$ are established in correspondence with the respective mesh points $P(i, j)$ and the diffusion Equation (1) is solved for these arrays using the finite difference method to determine the materials concentration distribution at time t. No directional properties are assigned to the diffusion coefficients Dx, Dy, and Dz in the wet etching process so that $$Dx=Dy=Dz=D1$$

where D1 is a constant. Thereafter, the concentration $C(i, j)$ at the respective mesh points $P(i, j)$ are determined by interpolation and the contour surface $C1=0.50$ is drawn as the etching front.

FIGS. 3A and 3B respectively illustrate a two-dimensional materials array $m(i, j)$ and concentration array $C(i, j)$ predicted when the recess 27 is formed by wet etching, i.e., at the completion of the initial process. The materials array value at each mesh point $P(i, j)$ where no material to be etched exists is zero, where the oxide film is present is 1, and where the substrate is present, the value is 2. The broken line 2 in FIGS. 3A and 3B indicates the etching front and the broken line 3 indicates the interface between the oxide film 21 and the substrate 20.

Figure 1:
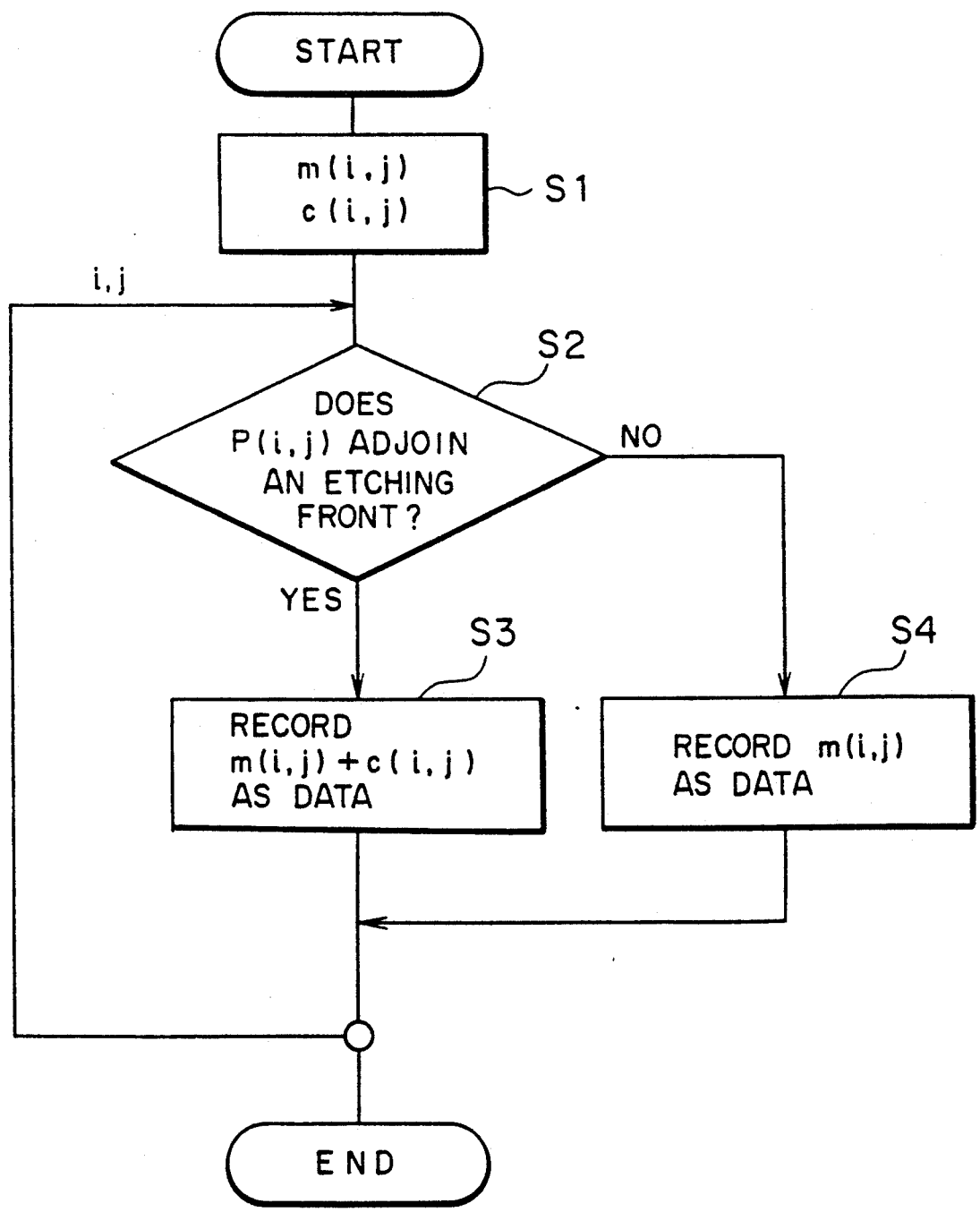
FIGS. 1 and 2 are flow charts respectively illustrating part of a topography prediction model according to the present invention.

The materials array $m(i, j)$ and the concentration array $C(i, j)$ determined at the conclusion of the first process are employed as the initial conditions of the second process, a dry etching process in the example being described. FIG. 1 is a flow diagram indicating the steps of a method according to an embodiment of the invention. At step S1, the materials array $m(i, j)$ and the concentration array $C(i, j)$ are the values obtained for the completion of the first process, i.e., the wet etching process. In step S2, the respective mesh points $P(i, j)$ are reviewed to determine whether respective mesh points adjoin the etching front 2. A mesh point adjoins an etching front if the values of the materials array m for the adjacent mesh points are 1 and 0 or 2 and 0. If a mesh point adjoins an etching front, the value of the materials array $m(i, j)$ for that mesh point is combined with the value of the concentration array $C(i, j)$ for that mesh point by writing the two values separated by a decimal point. Thus, in the resulting decimal number, the material information is carried as the integer portion of the decimal number and the concentration information is carried as the fractional portion of the decimal number. The decimal number is retained in step S3. The materials array and concentration array values for two mesh points that do not adjoin the etching front follow the flow of the process of FIG. 1 to step S4 where the materials array $m(i, j)$ is recorded as an initial condition for the next process. As in the conventional method, the concentration value is discarded. Steps S2, S3, and S4 are carried out for each mesh point to produce topographic information such as that shown in FIG. 3C. The hatched portions of FIG. 3C indicate mesh points P that adjoin the etching front 2 and contain in decimal number form both material and virtual particle concentration data.

Figure 2:
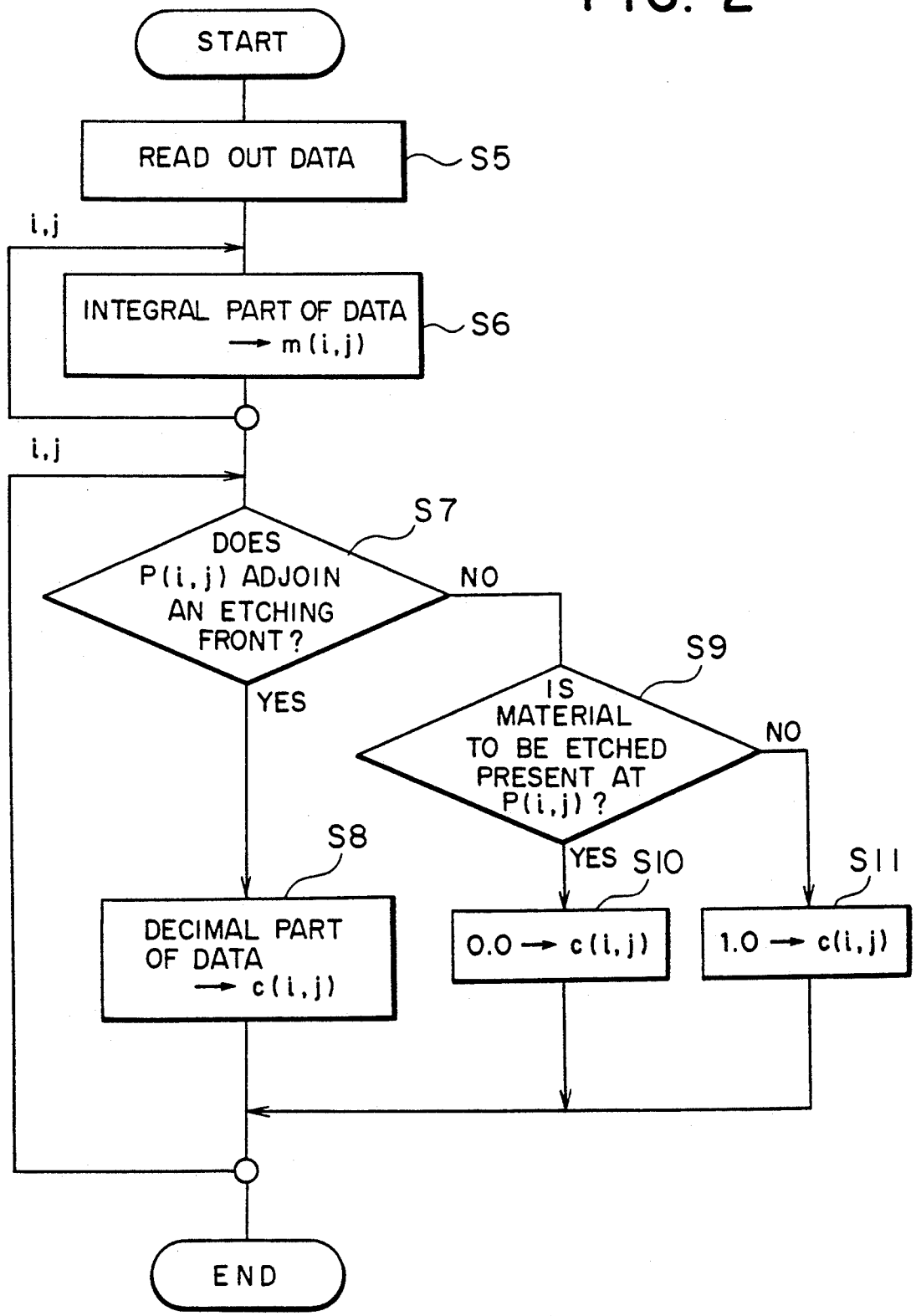
Figure 4:
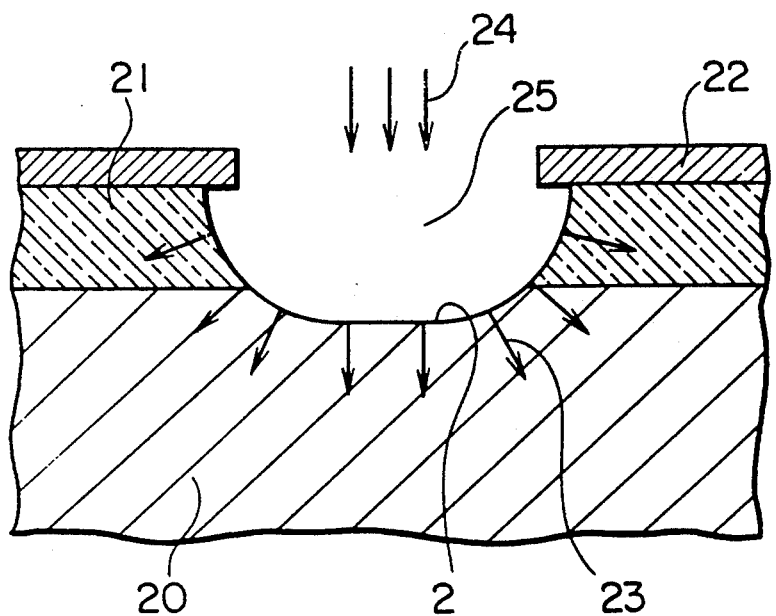
FIG. 4 is a cross-sectional view illustrating a wet etching process.
Figure 5:
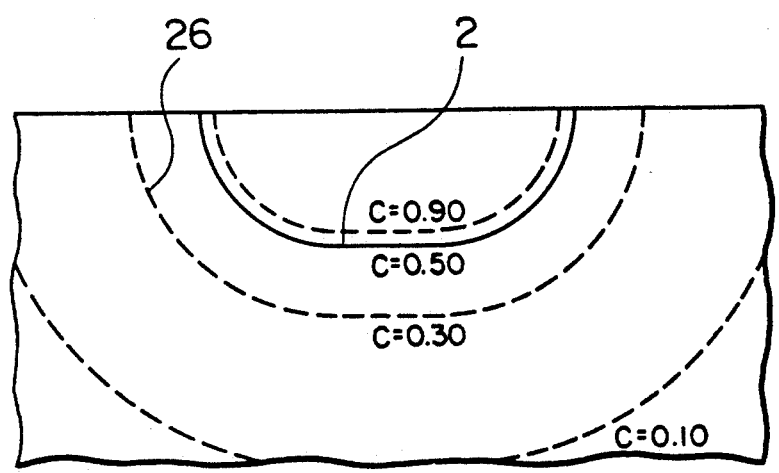
FIG. 5 illustrates the results of a prediction of the topography of a workpiece using the modified diffusion model for the wet etching process of FIG. 4.
Figure 6:
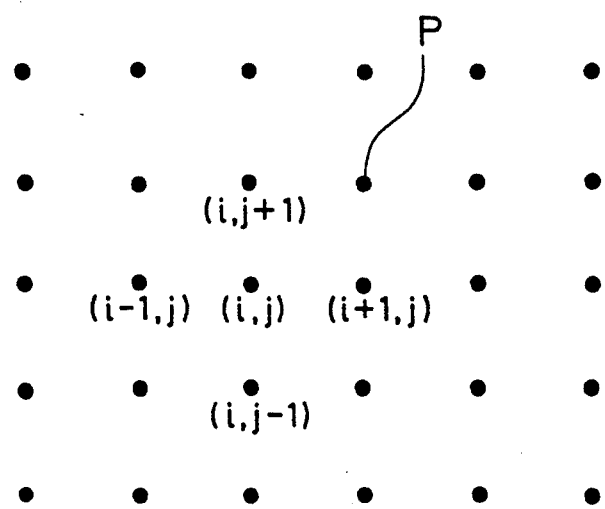
FIG. 6 illustrates an array of mesh points.
Figure 7:
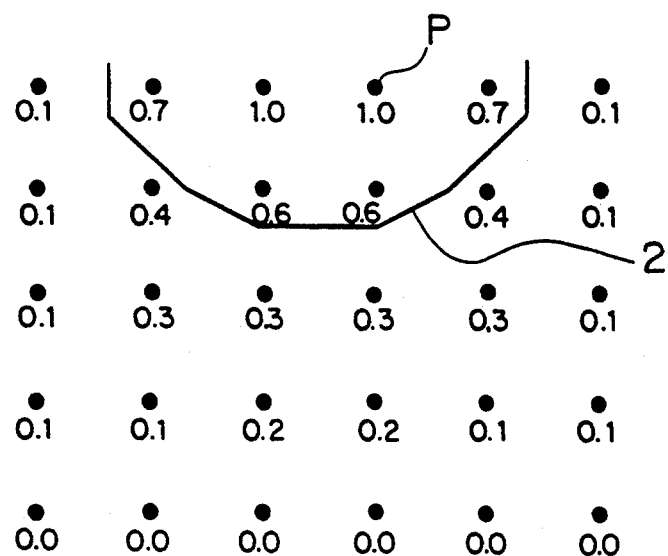
FIG. 7 illustrates interpolation to predict an etching front according to the present invention.

FIG. 2 is a flow chart of steps in a method according to the invention for reproducing the topographic data obtained at the conclusion of a prior process for use as the initial conditions of a subsequent second process, such as the dry etching process, following the wet etching process. In step S5, the topographic data of the type shown in FIG. 3A is obtained and the integer part of the data for each mesh point is assigned to the materials array $m(i, j)$ in step S6. In step S7, using the same test employed in step S2 of FIG. 1, a determination is made as to whether each mesh point adjoins the etching front 2. When a mesh point adjoins an etching front, the fractional part of the value is assigned to the concentration array $C(i, j)$ in step S8. For all other mesh points, the process proceeds to step S9 where it is determined whether a material to be etched exists at the respective mesh point. If a material that may be etched exists at a mesh point, a value of zero is assigned to the concentration array $C(i, j)$ in step S10. If no material that may be etched is present, the value of the concentration array is 1. Steps S7–S11 are executed as appropriate for each of the mesh points, and the initial values of the materials array and of the concentration array for the second process are assigned, as illustrated in FIGS. 3D and 3E.

A comparison of the data shown in FIGS. 3B and 3E of the concentration array values at the mesh points that adjoin the etching front 2 shows that a precise reproduction of the results of the first process is achieved. In other words, important etching topography information from each former process is transferred as the initial value of the subsequent process with a high degree of accuracy.

In the specific example described, the topography resulting from the dry etching process in which a hole 29 extending from the bottom of the recess 27 of FIG. 9 is predicted using the initial values of the materials array and concentration array from the wet etching process of FIG. 8 in conjunction with the modified diffusion model. Both the initial wet etching process and the subsequent dry etching process are considered to take place in the same fashion except that the diffusion coefficients Dx, Dy, and Dz have different values for the two processes. By employing different diffusion coefficients, the directionality of the dry etching process is accurately included in the prediction.

The topography prediction method described is not limited to predicting the topography of contact holes and may be generally applied to processes sequentially carried out with respect to a semiconductor workpiece. For example, the topography of the workpiece can be predicted, employing the modified diffusion model, for the deposition of an oxide film and its subsequent etching in the formation of side walls for a lightly doped drain field effect transistor, the formation of contact holes, and the burial of metallic materials in a contact hole, all conducted successively, as well as the successive deposition of a resist film and its formation into a particular pattern by photolithography.

All of the processes carried out have respective process conditions or parameters that affect the rate or degree of the process. For example, in wet etching, the temperatures of the etchant and workpiece, the concentration of the etchant, and other conditions influence the rate of etching. In dry etching, the bias voltage, etchant species, ambient pressure, and other conditions affect the rate and directionality of etching. Generally, these conditions affect the values of the diffusion coefficients $D_x$, $D_y$, and $D_z$. Thus, by specifying or altering the diffusion coefficients, process conditions can be altered so that the topography changes as a function of process conditions can be predicted.

Figure 12:
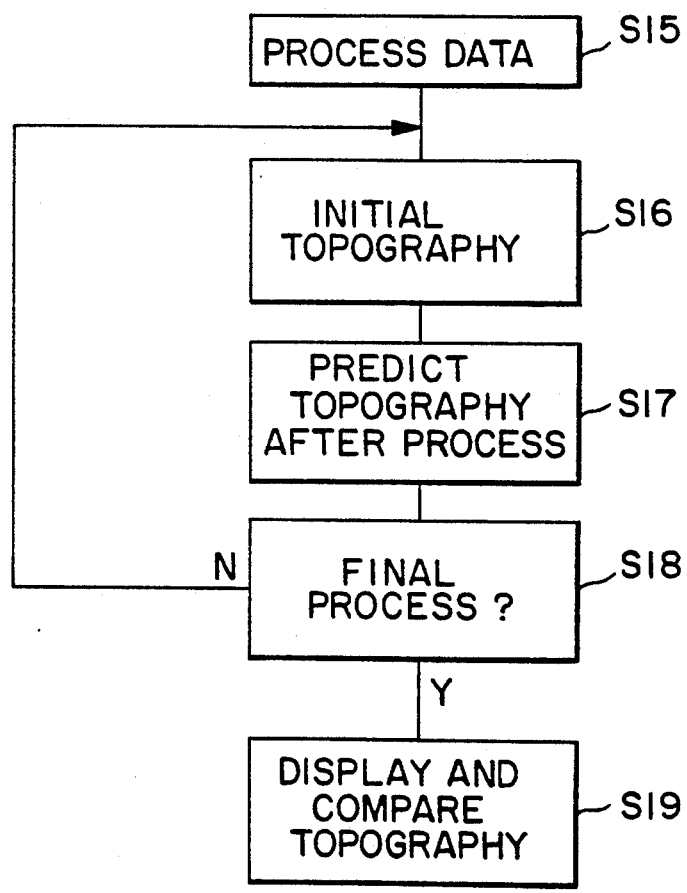
FIG. 12 is a flow chart illustrating steps according to an embodiment of the invention.

The topography predictions carried out pursuant to the method of the present invention are generally performed with a computer. FIG. 11 is a schematic diagram of a computer system for performing the method. The computer system includes a host computer 31, a graphical display means 32, such as a cathode ray tube, a printer, a plotter, or a combination of them, an input means 33, such as a keyboard, a disc drive and the like and combinations of these specific input devices, and a data storage means 34, such as a magnetic medium including hard discs or floppy discs and the like. FIG. 12 is a flow chart illustrating application of the present invention to a multiple process manufacturing sequence.

Turning to FIG. 12, initially, in step S15, the sequence of processing steps, such as etching, film deposition, and the like, in a multiple step process carried out on a semiconductor workpiece is specified. Each process includes relevant process conditions, such as temperature, time, ambient pressure, and the like, according to the particular process. Generally, the diffusion coefficients specified for each etching process incorporate these conditions.

In the step S16, the initial topography of the workpiece is specified. Before the initial process of the sequence, that topography is merely the initial shape of the workpiece. In subsequent processing steps, the initial topography is the final topography predicted at the conclusion of the immediately preceding process. After determining the initial topography in step S16, whether it is the initial workpiece shape or the shape of the work piece after one or more prior processes have been completed, the topography at the completion of the next process, taking into the account changes that are produced by the process, is predicted in step S17. The prediction is carried out in accordance with the previous discussion employing the modified diffusion model. The materials and concentration arrays of virtual particles predicted at the completion of each sequence are stored in the data storage means 34 as integer and fractional portions of a decimal number, at least for the points adjacent an etching front, as described above, so that the topography predicted for each subsequent process is based upon an accurate representation of the topography predicted for the previous process.

In step S18, it is determined whether all of the successive processes specified in step S15 have been completed. If additional process steps and corresponding topographic predictions remain to be carried out, steps S16 and S17 are repeated until the entire sequence is completed. At the completion of the prediction process, the predicted topography is displayed graphically, for example, on the graphic display means 32 of FIG. 11. An example of such a graphical display is shown in FIG. 13. The topography of the example shown in FIG. 13 includes four trenches that are etched into a substrate. Using conventional graphical techniques, the dimensions of the topographical features can be determined from the graphical display. That graphical display is compared to a final topography that is desired to be reproduced by the sequence of processes. If the predicted topography deviates from the desired final topography, then changes in the conditions of one or more of the processes in the sequence are made. After those changes are made in the input data at step S15, the entire process of FIG. 12 is repeated. In subsequent iterations, as required, various process parameters are altered until the desired final topography is achieved. By repeatedly carrying out the prediction method, appropriate process conditions for the various processes are determined without carrying out actual experiments. Since, according to the method of the present invention the precision of the final topography prediction is improved, particularly when a very large number of sequential processes are carried out, the need for adjustments of process conditions when the actual sequence of processes is carried out in a semiconductor device manufacturing operation is reduced as compared to the prior, less accurate topography predictions.

We claim:

1. A method of predicting the topography of a semiconductor workpiece after a plurality of manufacturing processes, each process changing the topography of the workpiece, are carried out on the workpiece comprising:

establishing a desired topography for a semiconductor workpiece after sequential performance of a plurality of processes changing the topography of the workpiece are carried out on the workpiece;

specifying, for each process, conditions for performing the respective process;

establishing a plurality of points in a grid in a space including the workpiece;

identifying the materials comprising the workpiece and the concentration of virtual particles representing the topography of the workpiece at each of the points before a first process on the workpiece;

using the modified diffusion model equation to predict the material and concentration of virtual particles at each of the points after the completion of the first process in the sequence of processes;

recording the material and virtual particle concentration for at least some of the points at the completion of the first process as a decimal number including an integer part representing the material and a decimal part representing the concentration of virtual particles;

using the modified diffusion model to predict the materials and concentrations of virtual particles at each point after a second process beginning with the materials and virtual particle concentrations for each point from the prediction of the first process;

repeating the topography prediction for each of the plurality of processes to predict a final topography, each prediction employing as the initial materials and virtual particle concentrations the materials and virtual particle concentrations predicted at the completion of the immediately preceding process;

graphically displaying the final topography and comparing the final topography to the desired topography; and altering the conditions of at least one of the processes and repeating the topography prediction and graphical display steps until the desired topography is obtained for the sequence of processes.

* * * * *